United States Patent [19]
Sono et al.

[11] Patent Number: 5,444,025
[45] Date of Patent: Aug. 22, 1995

[54] PROCESS FOR ENCAPSULATING A SEMICONDUCTOR PACKAGE HAVING A HEAT SINK USING A JIG

[75] Inventors: Michio Sono; Kouji Saito; Masashi Takenaka; Masanori Yoshimoto, all of Kawasaki, Japan

[73] Assignee: Fujitsu Limited, Kawasaki, Japan

[21] Appl. No.: 324,494

[22] Filed: Oct. 18, 1994

Related U.S. Application Data

[63] Continuation of Ser. No. 962,117, Oct. 16, 1992, abandoned.

[30] Foreign Application Priority Data

Oct. 23, 1991 [JP] Japan .................. 3-275710

[51] Int. Cl.6 ............. H01L 21/52; H01L 21/56; H01L 21/58; H01L 21/60
[52] U.S. Cl. ..................... 437/207; 257/796; 437/214; 437/217; 437/902; 437/925; 264/272.15; 264/272.17
[58] Field of Search .......................... 437/207

[56] References Cited

U.S. PATENT DOCUMENTS

| | | | |
|---|---|---|---|
| 3,414,968 | 12/1968 | Genser et al. | 437/902 |
| 3,675,089 | 7/1972 | Hantusch et al. | 437/902 |
| 3,902,148 | 8/1975 | Drees et al. | 357/70 |
| 4,107,727 | 8/1978 | Ikezawa et al. | 257/675 |
| 4,467,522 | 8/1984 | Marchisi | 437/902 |
| 5,083,373 | 1/1992 | Hamburgen | 437/902 |
| 5,091,341 | 2/1992 | Asada | 437/902 |
| 5,108,955 | 3/1992 | Ishida et al. | 437/902 |
| 5,147,821 | 9/1992 | McShane et al. | 437/902 |

FOREIGN PATENT DOCUMENTS

| | | | |
|---|---|---|---|
| 0232837 | 8/1987 | European Pat. Off. | |
| 2523397 | 9/1983 | France | 437/217 |
| 58-100447 | 6/1983 | Japan | 437/902 |
| 62-109326 | 5/1987 | Japan | 437/902 |
| 62-169450 | 7/1987 | Japan | |
| 63-222450 | 9/1988 | Japan | 437/902 |
| 1268157 | 9/1989 | Japan | 437/902 |
| 2-129951 | 5/1990 | Japan | |
| 3214763 | 9/1991 | Japan | 257/796 |

OTHER PUBLICATIONS

Patent Abstracts of Japan, vol. 12, No. 009 (E-572) 12 Jan. 1988 & JP-A-62 169 450 (Hitachi Ltd.) 25 Jul. 1987.

Patent Abstracts of Japan, vol. 14, No. 365 (E-961) 8 Aug. 1990 & JP-A-02 129 951 (Hitachi Ltd.) 18 May 1990.

Primary Examiner—Olik Chaudhuri
Assistant Examiner—David E. Graybill
Attorney, Agent, or Firm—Staas & Halsey

[57] ABSTRACT

A method of producing a semiconductor device includes the steps of fitting a bottom part of a radiator block within a tapered hole which is provided at a bottom of a recess of a jig and positioning on the jig a lead frame having inner and outer leads and wherein the lead frame has an opening at a central part thereof, the opening being located above a top surface of the radiator block. The semiconductor chip is then mounted on the top surface part of the radiator block and bonded to the lead frame by plurality of wires. The radiator block is then positioned on a lower die and an upper die is positioned on top of the lower die and a resin is injected into a cavity formed by the two dies so as to mold the resin and form a package which encapsulates at least a part of the radiator block, the semiconductor chip, the wires and inner leads of the lead frame so that the outer leads of the lead frame extend outwardly of the package and the bottom part of the radiator block projects from the package by a predetermined length to conduct heat generated from the semiconductor chip outside the package. The jig then is removed from the package.

12 Claims, 5 Drawing Sheets

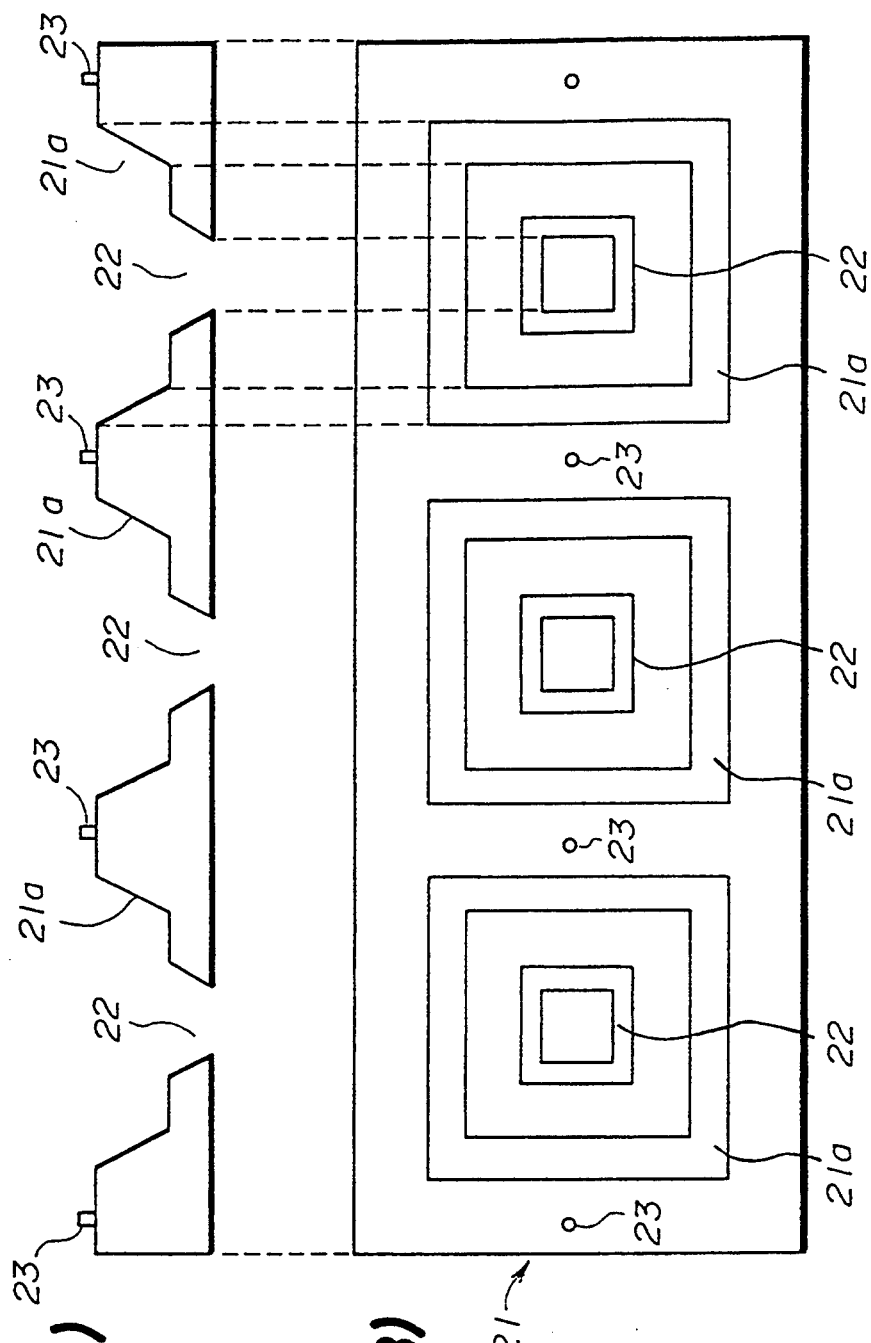

PROCESS FOR ENCAPSULATING A SEMICONDUCTOR PACKAGE HAVING A HEAT SINK USING A JIG

This application is a continuation, of application Ser. No. 07/962,117, filed Oct. 16, 1992, now abandoned.

BACKGROUND OF THE INVENTION

The present invention generally relates to semiconductor devices and methods of producing the same, and more particularly to a semiconductor device having a radiator structure and to a method of producing such a semiconductor device.

Recently, due to the improved integration density of semiconductor devices, the amount of heat generated by the semiconductor device has increased. Hence, there are semiconductor devices having a radiator structure for releasing the heat generated from the semiconductor device. It is desirable that the semiconductor device having such a radiator structure be produced with-ease and with high dimensional accuracy.

FIG. 1 shows an example of a conventional semiconductor device having a radiator structure. In a semiconductor device 1A shown in FIG. 1, a radiator block 3 having a flange 3a is provided at a central opening part of inner leads 2a of a lead frame 2. The radiator block 3 has an inverted trapezoidal cross section. Ends of the inner leads 2a and the flange 3a of the radiator block 3 are fixed by calking at a calked part 4.

A semiconductor chip 5 is mounted on the radiator block 3 by soldering or the like, and this semiconductor chip 5 is bonded to the inner leads 2a by wires 6. In other words, a die-bonding is made using one surface of the radiator block 3 as a stage. The semiconductor chip 5, the inner leads 2a and the like are encapsulated by a resin which is molded to form a package 7, and outer leads 2b are thereafter bent in an approximate S-shape or a gull-wing shape to suit the semiconductor device 1A for surface mounting.

The radiator block 3 is mounted on the inner leads 2a at the calked part 4. Hence, the thickness of the lead frame 2 must be 300 to 400 μm at the minimum in order to enable the calking. In other words, because the radiator block 3 is fixed to the lead frame 2, it is necessary to make the calking which limits the thickness of the lead frame 2. Furthermore, in order to enable the calking, the radiator block 3 must be made of a metal.

On the other hand, when injecting the resin into a metal die so as to mold the resin and form the package 7, the accuracy of the position of the exposed surface of the radiator block 3 becomes poor depending on the injection pressure. That is, it is difficult to control the position of the exposed surface of the radiator block 3. In addition, resin burr or flash occurs if the position of the exposed surface of the radiator block 3 changes. The resin burr or flash may deteriorate the thermal conduction efficiency of the radiator block 3 when the semiconductor device 1A is mounted on a circuit substrate (not shown) or the like. Furthermore, if resin burr or flash exists, the adhesion of the radiator block 3 to the circuit substrate via an adhesive agent becomes poor when the semiconductor device 1A is mounted on the circuit substrate, because the adhesive agent used would naturally have good adhesion to the metal forming the radiator block 3 and not to the resin forming the resin burr or flash.

Moreover, when producing the semiconductor device 1A, the relatively heavy radiator block 3 which is made of a metal must hang from the lead frame 2 when molding the resin to form the package 7. However, the lead frame 2 is thin as described above to enable the calking, and it is difficult to stably support the radiator block 3 in the correct position during the molding process, and unwanted bends may be formed in the lead frame 2.

SUMMARY OF THE INVENTION

Accordingly, it is a general object of the present invention to provide a novel and useful semiconductor device and method of producing the same, in which the problems described above are eliminated.

Another and more specific object of the present invention is to provide a semiconductor device comprising a lead frame having an opening at a central part thereof and a plurality of leads which are respectively made up of an inner lead and an outer lead, a radiator block provided under the opening of the lead frame, where the radiator block has a top surface part and a bottom part and a gap is formed between the top surface part of the radiator block and the lead frame, a semiconductor chip mounted on the top surface part of the radiator block, a plurality of wires connecting the semiconductor chip and the leads, and a package which encapsulates at least a part of the radiator block, the semiconductor chip, the wires and the inner leads of the leads so that the outer leads extend outwardly of the package, where the package fills the gap between the top surface part of the radiator block and the lead frame, and the bottom part of the radiator block projects from the package by a predetermined length to conduct heat generated from the semiconductor chip outside the package. According to the semiconductor device of the present invention, it is possible to obtain a satisfactory thermal conductivity by selecting an arbitrary material for the radiator block without being restricted in the selection, and the thickness of the lead frame does not need to be limited for calking because no calking is required to produce this semiconductor device. Moreover, the mounting of the semiconductor device on a circuit substrate or the like is facilitated because the projecting length of the radiator block can be controlled with a high accuracy.

Still another object of the present invention is to provide a method of producing a semiconductor device comprising the steps of (a) fitting a bottom part of a radiator block within a tapered hole which is provided at a bottom of a recess of a jig, (b) positioning on the jig a lead frame which has an opening at a central part thereof, where the opening is located above a top surface part of the radiator block, (c) mounting a semiconductor chip on the top surface part of the radiator block and bonding the semiconductor chip to the lead frame by a plurality of wires, (d) positioning at least the radiator block on a lower metal die, and (e) positioning an upper metal die on top of the lower metal die and injecting a resin into a cavity which is formed inside the upper and lower metal dies so as to mold the resin and form a package which encapsulates at least a part of the radiator block, the semiconductor chip, the wires and inner leads of the lead frame so that outer leads of the lead frame extend outwardly of the package, where the bottom part of the radiator block projects from the package by a predetermined length to conduct heat generated from the semiconductor chip outside the package. According to the method of producing a semiconductor device according to the present invention, it is unnecessary to carry out calking, and the thickness of the lead frame will not be limited for the purpose of carrying out the calking. In addition, because the jig is used to accurately position the radiator block when molding the resin to form the package, it is possible to suppress the generation of resin burr or flash during the molding process, and furthermore, it is possible to accurately control the projecting length of the radiator block by the thickness of the jig.

Other objects and further features of the present invention will be apparent from the following detailed description when read in conjunction with the accompanying drawings.

BRIEF DESCRIPTION OF THE DRAWINGS

FIGS. 4(A) and 4(B) are a diagram for explaining a palette which is used in the embodiment of the method;

DESCRIPTION OF THE PREFERRED EMBODIMENTS

Figure 1:
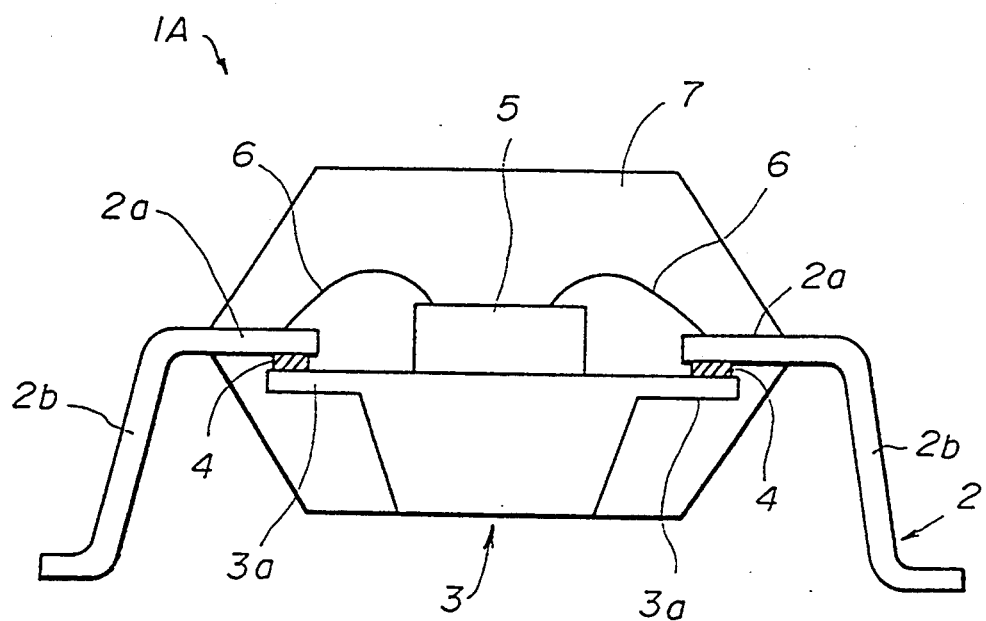
FIG. 1 is a side view in cross section showing an example of a conventional semiconductor device.
Figure 2:
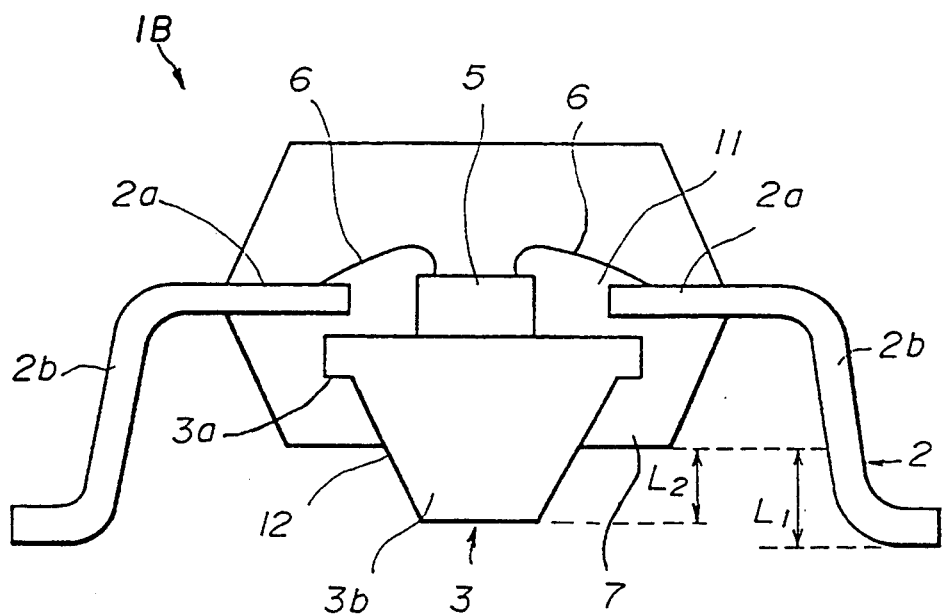
FIG. 2 is a side view in cross section showing an embodiment of a semiconductor device according to the present invention.
Figure 3A:
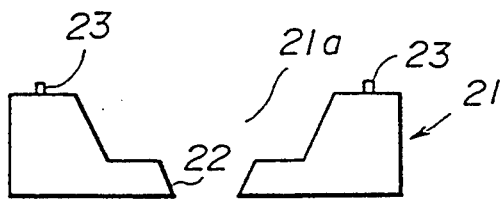
FIGS. 3(A)-3(E) show side views in cross section for explaining an embodiment of a method of producing a semiconductor device according to the present invention.
Figure 3B:
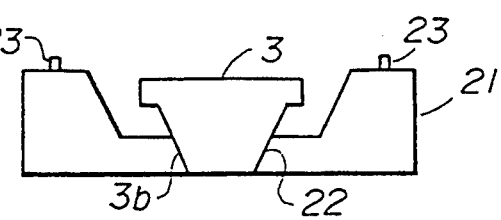
Figure 3C:
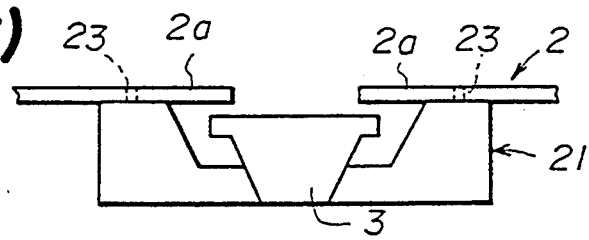
Figure 3D:
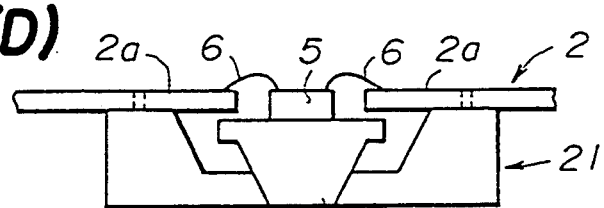
Figure 3E:
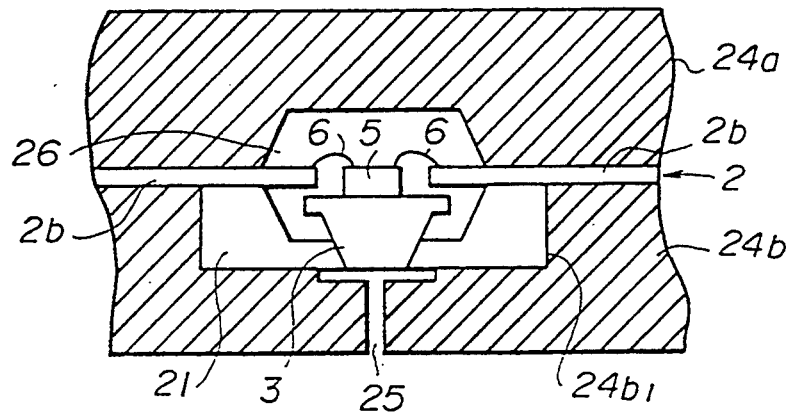
Figure 5A:
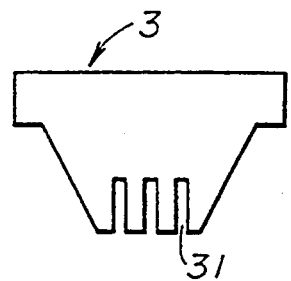
FIGS. 5(A)-5(D) are side views showing modifications of a radiator block.
Figure 5C:
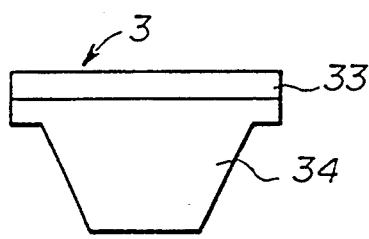
Figure 5B:
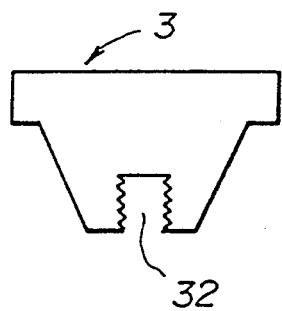
Figure 5D:
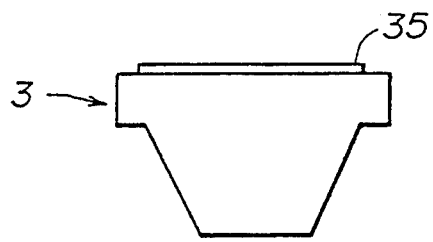

FIG. 2 shows an embodiment of a semiconductor device according to the present invention. In FIG. 2, those parts which are the same as those corresponding parts in FIG. 1 are designated by the same reference numerals, and a description thereof will be omitted.

In the semiconductor device 1B shown in FIG. 2, an opening 11 is formed at the central part of the lead frame 2 on the inner side of the inner leads 2a. The radiator block 3 has an inverted trapezoidal cross section and is positioned below the opening 11 independently of the lead frame 2. The radiator block 3 is made of a material having a satisfactory thermal conductivity compared to the resin which forms the package 7, including metals such as aluminum and non-metals such as ceramics.

The semiconductor chip 5 is mounted on the radiator block 3 by solder, silver paste or the like. The semiconductor chip 5 and the inner leads 2a are bonded by the wires 6. The semiconductor chip 5, the inner leads 2a and the like are encapsulated by a resin which is molded to form the package 7. In this case, a tip end 3b of the radiator block 3 projects from the bottom surface of the package 7 by a predetermined length. A tapered part 12 is formed on the radiator block 3 toward the tip end 3b. After the resin is molded to form the package 7, the outer leads 2b are bent in the S-shape or gull-wing shape to suit surface mounting of the semiconductor device 1B on a circuit substrate (not shown) or the like. Of course, the outer leads 2b may have other shapes, and may not be bent, depending on the kind of mounting used.

In this embodiment, a vertical length L1 of the outer lead 2b from the bottom surface of the package 7 is selected to 0.05 to 0.2 mm, for example. In addition, a projecting length L2 of the radiator block 3 from the bottom surface of the package 7 is selected so that L2<L1 to suit surface mounting of the semiconductor device 1B. The surface mounting of the semiconductor device 1B on the circuit substrate will be described later.

Next, a description will be given of an embodiment of a method of producing the semiconductor device according to the present invention, by referring to FIG. 3. In this embodiment of the method, it is assumed for the sake of convenience that the embodiment of the semiconductor device 1B shown in FIG. 2 is produced.

This embodiment of the method uses a palette or jig 21 shown in FIG. 3 (A). The palette 21 has a recess 21a, a tapered hole 22 provided at the bottom of the palette 21, and positioning pins 23 provided on the palette 21 to position the lead frame 2. The palette 21 is made of a metal which has a coefficient of thermal expansion close to or approximately the same as that of the lead frame 2. For example, copper, copper-tin alloy or the like may be used for the palette 21.

As shown in FIG. 3 (B), the tip end 3b of the radiator block 3 is fit into the hole 22 of the palette 21 and positioned. In other words, the tapered part 12 of the radiator block 3 and the tapered shape of the wall defining the hole 22 correspond, and the positioning of the radiator block 3 can be made with a high accuracy.

The inner leads 2a of the lead frame 2 are respectively provided with a positioning hole, and the positioning pins 23 fit into the positioning holes of the inner leads 2a when the lead frame 2 is placed on the palette 21 as shown in FIG. 3 (C). Hence, the lead frame 2 is positioned on the palette 21 by the positioning pins 23.

Thereafter, the semiconductor chip 5 is die-bonded on the radiator block 3 by solder, silver paste or the like, as shown in FIG. 3 (D). Further, the semiconductor chip 5 and the inner leads 2a are bonded by the wires 6.

The structure shown in FIG. 3 (D) is positioned within a cavity 24b1 of a lower metal die 24b shown in FIG. 3 (E). A passage 25 is provided at the bottom of the cavity 24b1. One end of this passage 25 communicates to a part formed by the palette 21 and the radiator block 3, while the other end of this passage 25 is coupled to a vacuum source (not shown). Thus, the palette 21 and the radiator block 3 are positioned under vacuum suction via the passage 25.

Then, an upper metal die 24a is positioned on top of the lower metal die 24b as shown in FIG. 3 (E), and a resin is injected into a cavity 26 of the upper metal die 24a via a gate (not shown) so as to mold the resin and form the package 7. After the molding process, the vacuum suction is released, and the upper and lower metal dies 24a and 24b and the palette 21 are removed. As a result, the package 7 which has the tip end 3b of the radiator block 3 projecting by a predetermined length is obtained. The outer leads 2b are bent thereafter if necessary.

Because the lead frame 2 and the radiator block 3 of the semiconductor device 1B are independent of each other, it is unnecessary to carry out a calking process and there is no need to limit the thickness of the lead frame 2 therefor. For this reason, the radiator block 3 can be made of a material other than metal. In addition, since the radiator block 3 is positioned by the palette 21 and subject to the vacuum suction, it is possible to accurately control the length of the tip end 3b of the radiator block 3 projecting from the package 7 by the thickness of the palette 21. Furthermore, because the palette 21 and the radiator block 3 are positioned by the vacuum suction, it is possible to prevent the generation of resin burr or flash during the molding process.

FIGS. 4(A) and (B) show in more detail the palette 21 which is used in this embodiment of the method. FIG. 4 (A) shows a side view of the palette 21, and FIG. 4 (B) shows a plan view of palette 21. The palette 21 shown in FIGS. 4(A) and (B) integrally has three recesses 21a which are connected. However, for mass production purposes, it is of course possible to provide more than three recesses 21a.

FIGS. 5(A)–(D) show modifications of the radiator block 3.

The radiator block 3 shown in FIG. 5 (A) has slits 31 formed on the tip end part thereof. In this case, the radiator block 3 has a fin shape, and the thermal conduction efficiency can be improved because the effect is basically the same as if the fins were directly mounted on the semiconductor chip 5.

The radiator block 3 shown in FIG. 5 (B) has a threaded part 32 formed on the tip end part thereof. In this case, an external radiator member can be screwed onto the radiator block 3 by a screw to improve the thermal conduction efficiency.

The radiator block 3 shown in FIG. 5 (C) has a mounting part 33 formed on top thereof. This mounting part 33 is made of copper, for example, and the semiconductor chip 5 is mounted on the mounting part 33. A part 34 of the radiator block 3 other than the mounting part 33 is made of a metal such as aluminum which is different from the metal forming the mounting part 33. The mounting part 33 and the part 34 are connected by thermocompression bonding. In this case, it is possible to mount the semiconductor chip 5 on the mounting part 33 not only by silver paste but also by solder. In addition, because the radiator block 3 is made mostly of aluminum, it is possible to reduce the weight of the semiconductor device 1B, and further, the surface of the aluminum can be subjected to an insulation process by an anodic oxidation.

Alternatively, the mounting part 33 may be made of aluminum and the part 34 may be made of copper in FIG. 5 (C). In this case, the radiator block 3 can be soldered directly when mounting the semiconductor device 1B on the circuit substrate.

The radiator block 3 shown in FIG. 5 (D) is made of a ceramic. In this case, the semiconductor chip 5 may be mounted on the radiator block 3 by silver paste. In addition, if a metal layer 35 is provided on top of the radiator block 3, it is possible to mount the semiconductor chip 5 on the metal layer 35 by solder.

In the case of the radiator block 3 shown in FIG. 5 (D), the matching with the semiconductor chip 5 is particularly satisfactory because the coefficient of thermal expansion of the ceramic radiator block 3 becomes approximately the same as that of the semiconductor chip 5. Moreover, the ceramic radiator block 3 can be produced at a low cost, and the relatively rough surface of the ceramic provides good adherence to the circuit substrate when mounting the semiconductor device 1B onto the circuit substrate.

Figure 6:
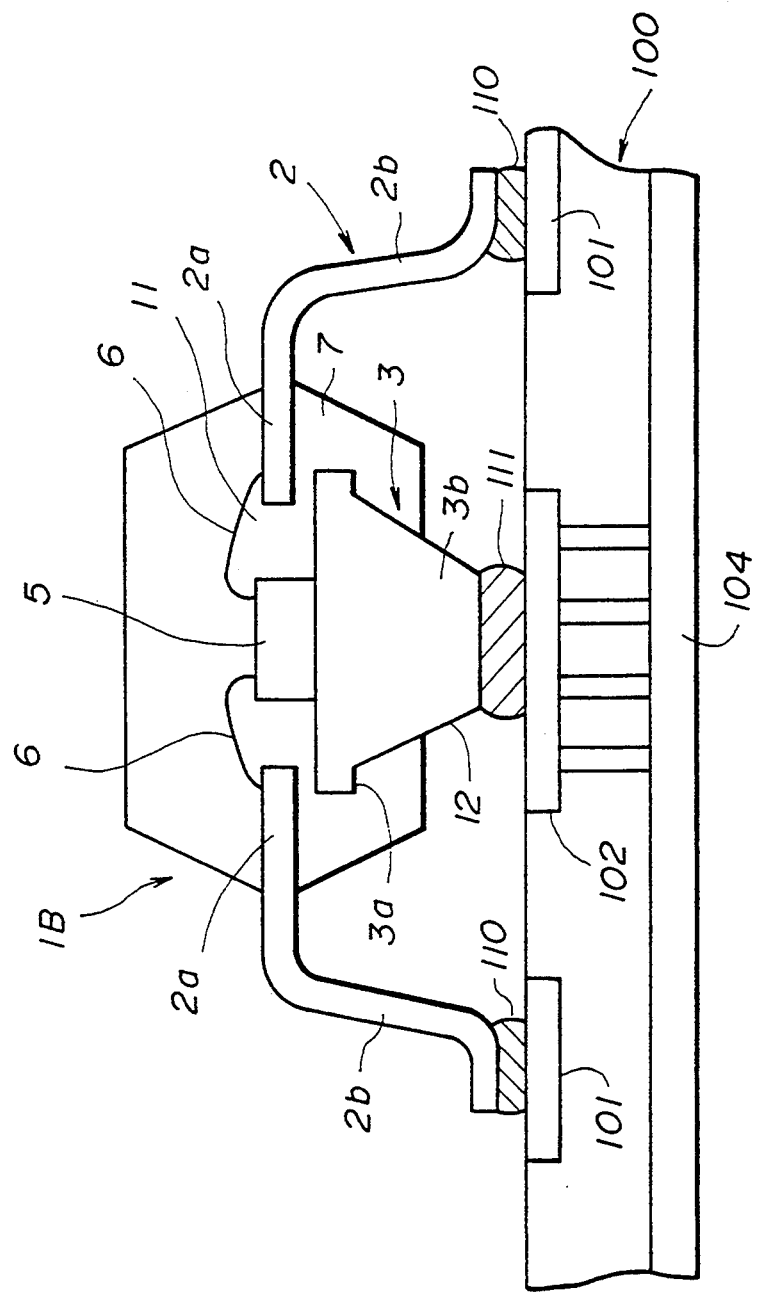
FIG. 6 is a side view in cross section showing the embodiment of the semiconductor device mounted on a circuit substrate.

Next, a description will be given of the mounting of the semiconductor device 1B described above onto a circuit substrate, by referring to FIG. 6. In FIG. 6, those parts which are the same as those corresponding parts in FIG. 2 are designated by the same reference numerals, and a description thereof will be omitted.

In FIG. 6, each outer lead 2b is connected to a contact 101 of a circuit substrate 100 by a solder 110. On the other hand, the tip end 3b of the radiator block 3 is adhered on a thermal conduction part 102 by an adhesive agent 111 having a satisfactory thermal conduction. For example, the thermal conduction part 102 may be made of a metal identical to that used for the radiator block 3. Therefore, the heat generated from the semiconductor chip 5 is transferred mainly through the radiator block 3 to the thermal conduction part 102 via the adhesive agent 111, and is finally released to a ground layer 104, for example. Because the projecting length of the tip end 3b of the radiator block 3 can be controlled with a high accuracy in the present invention, it is possible to improve the mounting of the semiconductor device 1B on the circuit substrate 100.

Further, the present invention is not limited to these embodiments, but various variations and modifications may be made without departing from the scope of the present invention.

What is claimed is:

1. A method of producing a semiconductor device comprising the steps of:
   (a) fitting a bottom part of a radiator block within a tapered hole which is provided at a bottom of a recess of a jig;
   (b) positioning on the jig a lead frame which has an opening at a central part thereof, said opening being located above a top surface part of the radiator block, said lead frame having inner leads and outer leads;
   (c) mounting a semiconductor chip on the top surface part of the radiator block and bonding the semiconductor chip to the lead frame by a plurality of wires;
   (d) positioning at least the radiator block on a lower die;
   (e) positioning an upper die on top of the lower die and injecting a resin into a cavity which is formed inside the upper and lower dies so as to mold the resin and form a package which encapsulates at least a part of the radiator block, the semiconductor chip, the wires and inner leads of the lead frame so that the outer leads of the lead frame extend outwardly of the package,
   the bottom part of the radiator block projecting from the package by a length to conduct heat generated from the semiconductor chip outside the package; and
   (f) removing the jig from the package.

2. The method of producing the semiconductor device as claimed in claim 1, wherein said step (a) uses a radiator block which has an approximate inverted trapezoidal shape in cross section.

3. The method of producing the semiconductor device as claimed in claim 1, wherein said step (a) uses a radiator block which is made of a material having a thermal conductivity greater than that of the resin which forms the package.

4. The method of producing the semiconductor device as claimed in claim 3, wherein said step (a) uses a radiator block which is made of a material selected from a group consisting of metals and ceramics.

5. The method of producing the semiconductor device as claimed in claim 1, which further comprises the step (g) of forming the outer leads to an approximate S-shape so that each of the outer leads has a vertical length L1 from a bottom surface of the package towards a direction in which the radiator block projects, said step (a) uses a jig which is shaped so that the bottom part of the radiator block projects a length L2 from the bottom surface of the package after said step (e), and L1>L2.

6. The method of producing the semiconductor device as claimed in claim 1, wherein said step (a) uses a radiator block which includes a plurality of slits formed at the bottom part thereof.

7. The method of producing the semiconductor device as claimed in claim 1, wherein said step (a) uses a radiator block which includes engaging means provided at the bottom part thereof for engaging an external radiator member.

8. The method of producing the semiconductor device as claimed in claim 1, wherein said step (a) uses a radiator block which has a top surface part and a bottom part thereof made of mutually different metals.

9. The method of producing the semiconductor device as claimed in claim 1, wherein said step (a) uses a radiator block which has a top surface part made of a metal layer and a bottom part made of a ceramic material.

10. The method of producing the semiconductor device as claimed in claim 1, wherein said step (b) positions the lead frame on the jig by fitting positioning pins of the jig into corresponding holes of the lead frame.

11. The method of producing the semiconductor device as claimed in claim 1, wherein said step (d) positions the radiator block and the package by placing the bottom part of the radiator block at a passage of the lower die so that the radiator block and the package are positioned under vacuum suction via the passage.

12. The method of producing the semiconductor device as claimed in claim 1, wherein said step (b) positions the lead frame on the jig so that the inner leads partially overlap the radiator block.

* * * * *